(12) United States Patent
Tsai

(10) Patent No.: US 7,859,118 B2
(45) Date of Patent: Dec. 28, 2010

(54) MULTI-SUBSTRATE REGION-BASED PACKAGE AND METHOD FOR FABRICATING THE SAME

(75) Inventor: Shiann-Tsong Tsai, Hsinchu (TW)

(73) Assignee: UTAC (Taiwan) Corporation, Hsinchu (TW)

( * ) Notice: Subject to any disclaimer, the term of this patent is extended or adjusted under 35 U.S.C. 154(b) by 280 days.

(21) Appl. No.: 12/228,755

(22) Filed: Aug. 15, 2008

(65) Prior Publication Data

US 2009/0045527 A1 Feb. 19, 2009

(30) Foreign Application Priority Data

Aug. 17, 2007 (TW) .............................. 96130445 A
May 27, 2008 (TW) .............................. 97119472 A

(51) Int. Cl.
 *H01L 23/48* (2006.01)
(52) U.S. Cl. ................ 257/777; 257/693; 257/698; 257/773; 257/780; 257/782; 257/783; 257/784; 257/E25.03; 257/E23.02; 438/109; 438/118; 438/127
(58) Field of Classification Search ......... 257/678–733, 257/737, 777, E23.001–E23.194, E25.03; 438/15, 25–28, 51, 55, 64–68, 106–127, 438/FOR. 340–FOR. 384
See application file for complete search history.

(56) References Cited

U.S. PATENT DOCUMENTS

| | | | | | |
|---|---|---|---|---|---|
| 4,586,242 | A | * | 5/1986 | Harrison | ................... 438/18 |
| 6,064,219 | A | * | 5/2000 | Aigner | ................... 324/763 |
| 6,288,445 | B1 | * | 9/2001 | Kimura | ................... 257/737 |
| 2008/0164601 | A1 | * | 7/2008 | Lin | ................... 257/693 |

\* cited by examiner

*Primary Examiner*—Jasmine J Clark
(74) *Attorney, Agent, or Firm*—Peter F. Corless; Steven M. Jensen; Edwards Angell Palmer & Dodge LLP

(57) ABSTRACT

A multi-substrate region-based package and a method for fabricating the same are provided. An active surface of a chip is divided into a plurality of functional regions, and each of the functional regions is electrically connected to a corresponding substrate via bonding wires. Each of the functional regions has a separate system, and the circuit layout thereof is not limited by the substrate or other systems but can be flexibly and independently designed, thereby allowing the package to be made smaller and thinner. Each set of the functional region and its corresponding substrate functions as an independent unit, such that the substrates are not affected by each other, thereby providing good compatibility, improved reliability and reduced packaging area.

21 Claims, 5 Drawing Sheets

MULTI-SUBSTRATE REGION-BASED PACKAGE AND METHOD FOR FABRICATING THE SAME

BACKGROUND OF THE INVENTION

1. Field of the Invention

The present invention relates to semiconductor packages, and more particularly, to a multi-substrate region-based package and a method for fabricating the same.

2. Description of Related Art

Conventional leadframe-based semiconductor package, such as a quad flat package (QFP), is fabricated by preparing a leadframe comprising a die pad and a plurality of leads, mounting a chip on the die pad, forming a plurality of bonding wires for electrically connecting bond pads formed on the chip to the corresponding leads, and encapsulating the chip and the bonding wires by an encapsulant.

Such conventional leadframe-based semiconductor package however has a drawback that the leads serving as input/output (I/O) connections can only be disposed around the encapsulant, that is, the number of I/O connections provided is limited by the size of the encapsulant, thereby failing to fulfill the requirement of further increase in I/O connections for the electronic products nowadays. Accordingly, a ball grid array (BGA) semiconductor package has been developed.

FIG. 1 shows a conventional BGA semiconductor package. In FIG. 1, a substrate 111 having a plurality of traces formed on a top surface and a bottom surface thereof is used, wherein the traces on the top surface are electrically connected to the traces on the bottom surface by internal conductive traces and vias (not shown) in the substrate 111. A chip 112 is mounted on the top surface of the substrate 111, and a plurality of bond pads 112a formed on the chip 112 are electrically connected to the traces on the top surface of the substrate 111 by a plurality of bonding wires 112. An encapsulant 114 is formed on the substrate 111, for encapsulating the chip 112 and the bonding wires 113. And, a plurality of solder balls 115 are implanted to a plurality of ball pads 111a formed at ends of the traces on the bottom surface of the substrate 111, allowing the chip 112 to be electrically connected to an external device via the solder balls 115. By this arrangement, more I/O connections can be obtained by means of the entire layout of traces and ball pads of the substrate 111.

However, the conventional BGA package configuration has gone out of date due to its poor compatibility with the progress trends of having lower profile, more functions and shorter life span for the electronic products. Therefore, high-density packaging (HDP) technologies, which can effectively fabricate package products with reduced sizes, have become a major focus in the industry.

Development of electronic engineering begins with developing an "element", then progresses to a stage of aggregating a plurality of "elements" (such as assembling a plurality of integrated circuits (IC) into a system), and eventually progresses to a stage of "integration", thereby attaining to the HDP technologies such as System on Chip (SoC), System in a Package (SiP) and Multi-Chip Package (MCP).

Each of the aforesaid HDP technologies has its own advantages and disadvantages. SoC integrates a processor unit, a memory and an analog signal processing unit all in a single chip. In some cases where SoC is not applicable, SiP (which integrates two or more chips in a single package) is used as an alternative choice. Generally, SoC is relatively more cost-effective, increases yield, and has less complex packaging than SiP. By contrast, SiP may package a plurality of chips, which are fabricated by different techniques and/or made of different materials, into a system while maintaining good compatibility among the chips.

Moreover, the difference between MCP and SiP is that MCP focuses more on aggregation of high-density memories in a vertical (Z) direction, thereby providing a small packaging area. On the other hand, SiP focuses more on packaging of high performance multi-functional chips in a horizontal (X-Y) direction, thereby providing good heat dissipation and reliability of the package.

Therefore, the problem to be solved herein is to develop a packaging technique which may combine the advantages of the aforesaid HDP technologies while eliminating their disadvantages.

SUMMARY OF THE INVENTION

In view of the above drawbacks in the prior art, an objective of the present invention is to provide a multi-substrate region-based package and a method for fabricating the same, which employ HDP technologies.

Another objective of the present invention is to provide a multi-substrate region-based package and a method for fabricating the same in which a plurality of functional regions are integrated in a single chip.

Still another objective of the present invention is to provide a multi-substrate region-based package and a method for fabricating the same, which are cost-effective, increase yield and avoid complex packaging.

A further objective of the present invention is to provide a multi-substrate region-based package and a method for fabricating the same, which provide good compatibility.

A further objective of the present invention is to provide a multi-substrate region-based package and a method for fabricating the same, which provide a small packaging area, high heat dissipation and good reliability.

In order to attain the above and other objectives, the present invention provides a multi-substrate region-based package, comprising: a chip having an active surface and a non-active surface, wherein the active surface of the chip is divided into a plurality of functional regions each having an independent first electrical connecting portion; a plurality of substrates each mounted to a corresponding one of the functional regions of the chip, wherein each of the substrates includes a plurality of bond pads, and a second electrical connecting portion corresponding to the first electrical connecting portion of the corresponding one of the functional regions; a plurality of bonding wires electrically connecting the first electrical connecting portions of the functional regions to the corresponding second electrical connecting portions of the substrates; and an encapsulant layer encapsulating the active surface of the chip, the substrates and the bonding wires, and having a plurality of openings where the bond pads of the substrates are exposed.

The present invention also provides a method for fabricating a multi-substrate region-based package, comprising: providing a chip and a plurality of substrates, wherein the chip has an active surface and a non-active surface, and the active surface is divided into a plurality of functional regions each having a first electrical connecting portion, and wherein each of the substrates includes a plurality of bond pads formed on a surface thereof, and a second electrical connecting portion formed on at least a side of the surface of each of the substrates; attaching each of the substrates to a corresponding one of the functional regions of the chip; electrically connecting the first electrical connecting portions of the chip to the second electrical connecting portions of the substrates via a plurality of bonding wires; and forming an encapsulant layer on the chip to encapsulate the substrates and the bonding wires, the encapsulant layer having a plurality of openings where the bond pads of the substrates are exposed.

Further in the present invention, a conductive material can be formed on the bond pads of the substrates, and the conductive material is reflowed to form conductive elements. Moreover, the plurality of substrates can be integrated on a substrate strip, and the substrate strip is formed with a plurality of openings for disposing the substrates therein and connecting the substrates to the substrate strip. After forming the encapsulant layer, the chip attached with the substrates is separated from the substrate strip.

In another embodiment of the present invention, a sub-chip may be disposed between each of the substrates and the chip, and is electrically connected to the corresponding substrate. The sub-chip has an active surface and a non-active surface, wherein the active surface of the sub-chip has a third electrical connecting portion that is electrically connected to the second electrical connecting portion of the corresponding substrate by bonding wires, and the non-active surface of the sub-chip has an adhesive layer attached to the active surface of the chip. The corresponding substrate has an adhesive surface having an adhesive layer by which the substrate is attached to the active surface of the sub-chip.

The first electrical connecting portion of each of the functional regions of the chip is situated on one side, two opposite sides or three sides of the corresponding functional region. If there is sufficient room, the first electrical connecting portion can be formed on four sides of the corresponding functional region. Each of the substrates can be larger or smaller in area than the corresponding functional region.

Therefore, the multi-substrate region-based package and the method for fabricating the same in the present invention use the HDP technologies to form a plurality of functional regions on the active surface of the chip. Each of the functional regions has a first electrical connecting portion and a substrate electrically connected the first electrical connecting portion. The integration of the plurality of functional regions in a single chip may increase yield while avoiding the use of the conventional complex SiP packaging technology. In addition, by combining a plurality of substrates with different functional regions of the chip, good compatibility, improved reliability and reduced packaging area can be provided. Moreover, the non-active surface of the chip is exposed, such that heat dissipation of the package can be greatly enhanced.

Furthermore, in the present invention, the chip is divided into a plurality of functional regions each being mounted with a corresponding substrate, such that system integration and circuitry design can be performed on each of the functional regions respectively, thereby allowing the package to be designed or made smaller and thinner as desired. This arrangement can also prevent bonding wires from being torn or pulled on each of the functional regions when the functional region is subjected to thermal expansion, thereby maintaining integrity of the bonding wires.

DETAILED DESCRIPTION OF PREFERRED EMBODIMENTS

Preferred embodiments of a multi-substrate region-based package and a method for fabricating the same proposed by the present invention are described in detail as follows with reference to FIGS. 2 to 4. It should be understood that the drawings are simplified schematic diagrams only showing the components relevant to the present invention, and the layout of components could be more complicated in practical implementation.

First Embodiment

FIGS. 2A to 2G are schematic diagrams showing a multi-substrate region-based package and a method for fabricating the same according to a first embodiment of the present invention.

Figure 1:
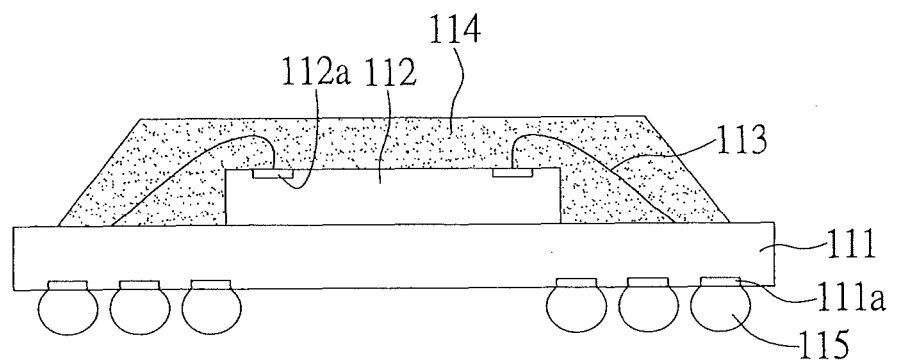
FIG. 1 is a schematic diagram showing a conventional ball grid array (BGA) semiconductor package.
Figure 2A:
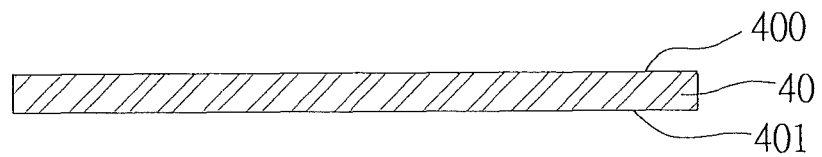
FIGS. 2A to 2G are schematic diagrams showing a multi-substrate region-based package and a method for fabricating the same according to a first embodiment of the present invention.
Figure 2B:
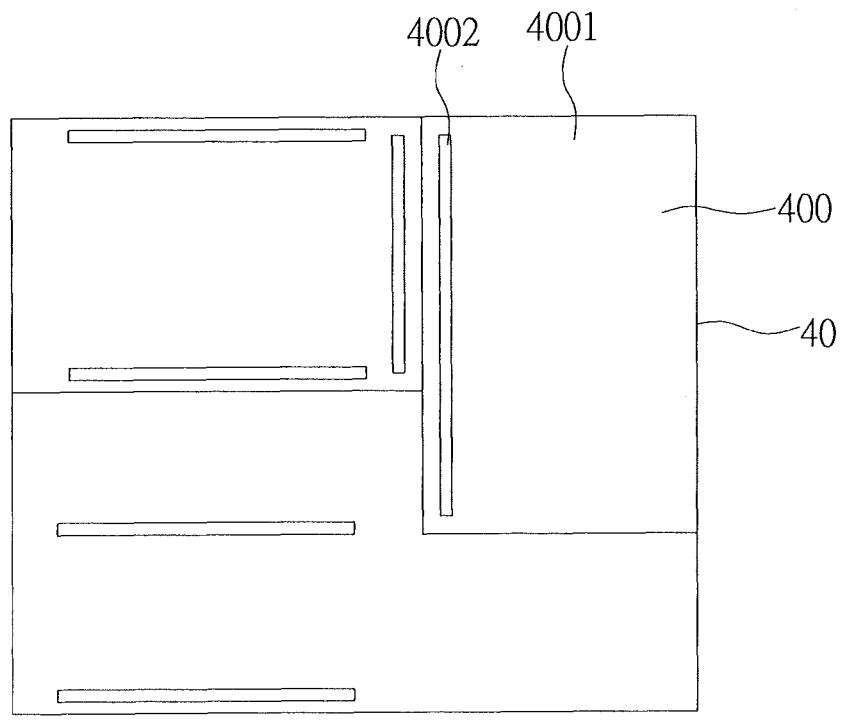

As shown in FIGS. 2A and 2B, a chip 40 having an active surface 400 and a non-active surface 401 is provided. The active surface 400 of the chip 40 is divided into a plurality of functional regions 4001 each having an independent first electrical connecting portion 4002. The first electrical connecting portion 4002 can be situated on one side, two opposite sides or three sides of the functional region 4001. If there is sufficient room, the first electrical connecting portion 4002 may also be situated on four sides of the functional region 4001.

Figure 2C:
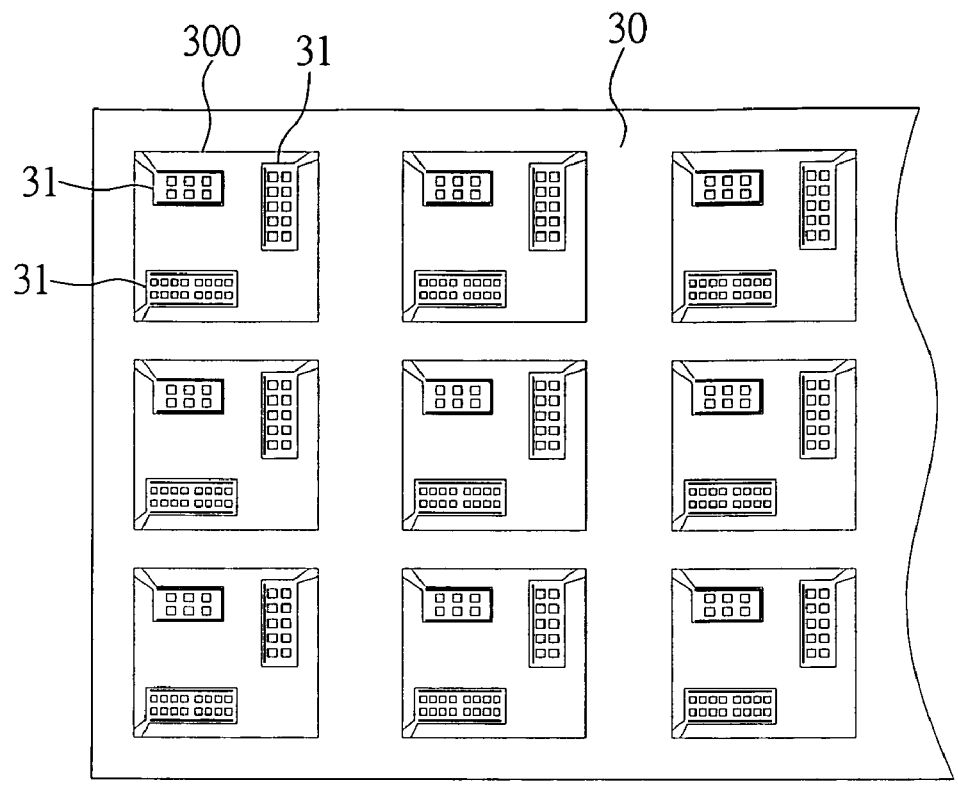
Figure 2D:
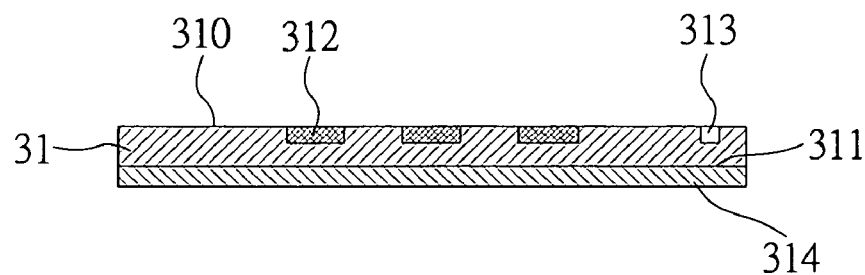

As shown in FIG. 2C, a substrate strip 30 is provided. The substrate strip 30 is formed with a plurality of openings 300, with a plurality of substrates 31 being disposed in the openings 300 respectively and connected to the substrate strip 30. Referring to FIG. 2D (a cross-sectional view of a substrate 31), the substrate 31 has a ball mounting surface 310 and an adhesive surface 311, wherein the ball mounting surface 310 has a plurality of bond pads 312 formed thereon and a second electrical connecting portion 313 corresponding to the first electrical connecting portion 4002 of the chip 40, and an adhesive layer 314 is attached to the adhesive surface 311 of the substrate 31.

Figure 2E:
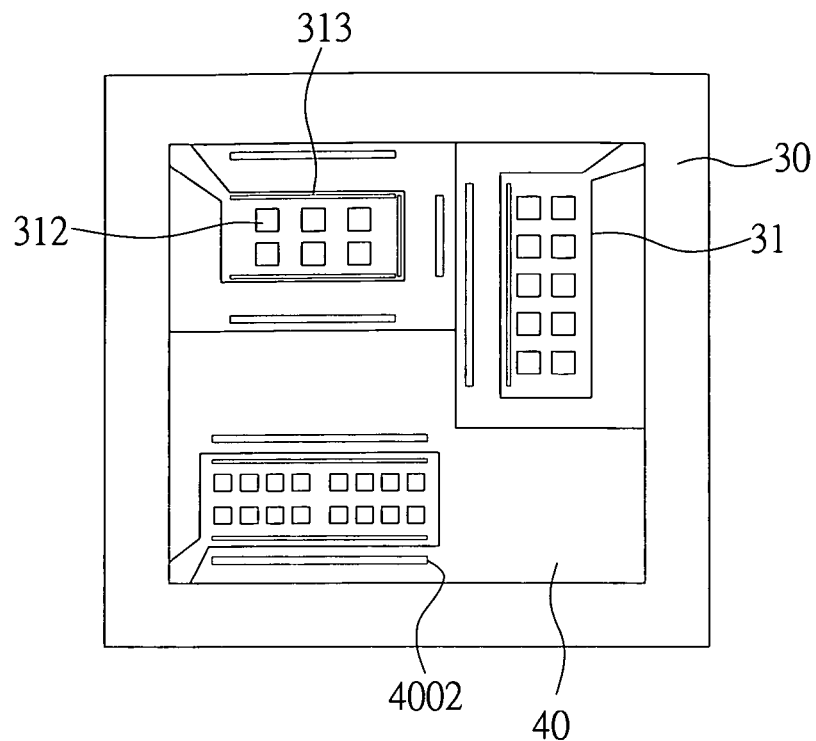

As shown in FIG. 2E, each of the substrates 31 is attached to a corresponding one of the functional regions 4001 of the chip 40 by attaching the adhesive layer 314 of each of the substrates 31 of the substrate strip 30 to the active surface of the chip 40. Alternatively, a plurality of substrates can be directly attached to the functional regions on the active surface of the chip without the use of a substrate strip.

Figure 2F:
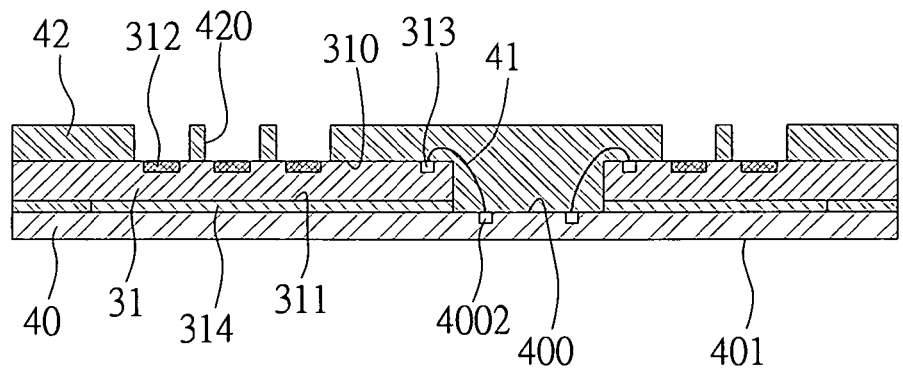

As shown in FIG. 2F, a wire-bonding process is performed on the second electrical connecting portion 313 of each of the substrates 31 and the first electrical connecting portion 4002 of the corresponding functional region 4001 of the chip 40, so as to form a plurality of bonding wires 41 for electrically connecting the second electrical connecting portions 313 of the substrates 31 to the first electrical connecting portions 4002 of the chip 40. Then, a molding process is performed to form an encapsulant layer 42 on the ball mounting surfaces 310 of the substrates 31 and the active surface 400 of the chip 40, wherein the encapsulant layer 42 is formed with a plurality of openings 420 for exposing the bond pads 312 of the substrates 31.

Figure 2G:
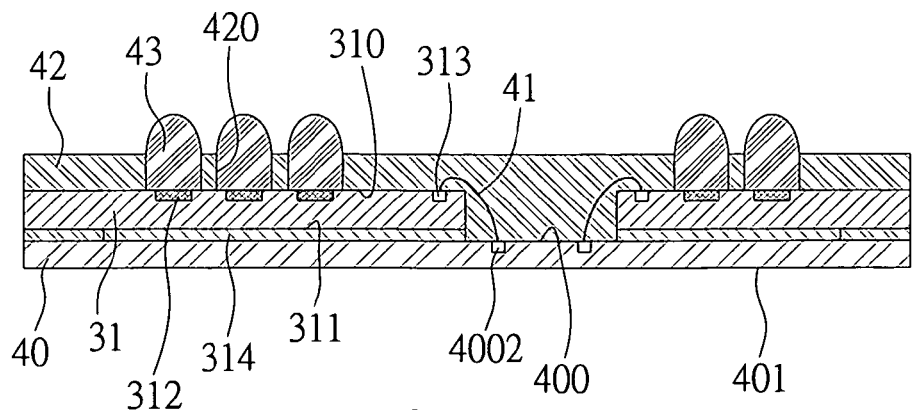

As shown in FIG. 2G, a conductive material 43, such as solder, is disposed on the bond pads 312 and in the openings 420 of the encapsulant layer 42, and is reflowed to form conductive elements on the bond pads 312. A singulation process is then performed to separate the chip 40 attached with the substrates 31 from the substrate strip.

By the above fabrication method, the present invention also provides a multi-substrate region-based package, comprising: a chip 40 having an active surface 400 and a non-active surface 401, wherein the active surface 400 is divided into a plurality of functional regions 4001 each having an independent first electrical connecting portion 4002; a plurality of substrates 31 each mounted to a corresponding one of the functional regions 4001 of the chip 40, wherein each of the substrates 31 has a ball mounting surface 310 and an adhesive surface 311, the ball mounting surface 310 including a plurality of bond pads 312 formed thereon, and a second electrical connecting portion 313 corresponding to the first electrical connecting portion 4002; a plurality of bonding wires 41 for electrically connecting the second electrical connecting portions 313 of the substrates 31 to the first electrical connecting portions 4002 of the chip 40 respectively; an encapsulant layer 42 formed on the ball mounting surfaces 310 of the substrates 31 and the active surface 400 of the chip 40, wherein the encapsulant layer 42 is formed with a plurality of openings 420 for exposing the bond pads 312 of the substrates 31; and a conductive material 43 disposed on the bond pads 312.

The conductive material 43 can be a solder material. The adhesive surface 311 of the substrate 31 has an adhesive layer 314 by which the substrate 31 can be attached to the active surface 400 of the chip 40.

Therefore, the multi-substrate region-based package and the method for fabricating the same in the present invention use the HDP technologies to form a plurality of functional regions 4001 on the active surface 400 of the chip 40. Each of the functional regions 4001 has a first electrical connecting portion 4002 and a substrate 31 electrically connected the first electrical connecting portion 4002. The integration of the plurality of functional regions in a single chip may increase yield while avoiding the use of the conventional complex SiP packaging technology. In addition, by combining a plurality of substrates 31 with different functional regions 4001 of the chip 40, good compatibility, improved reliability and reduced packaging area can be provided. Moreover, the non-active surface 401 of the chip 40 is exposed, such that heat dissipation of the package can be greatly enhanced.

Furthermore, when the different functional regions 4001 of the chip 40 may have different working temperatures by operation and have different degrees of thermal expansion, the plurality of substrates 31, which are not interconnected, are not affected by each other. Therefore, the bonding wires 41 disposed on the functional regions 4001 are not subjected to tearing or pulling due to the different degrees of thermal expansion and the effects from the substrates 31, thereby maintaining the integrity of the bonding wires 41.

Second Embodiment

Figure 3A:
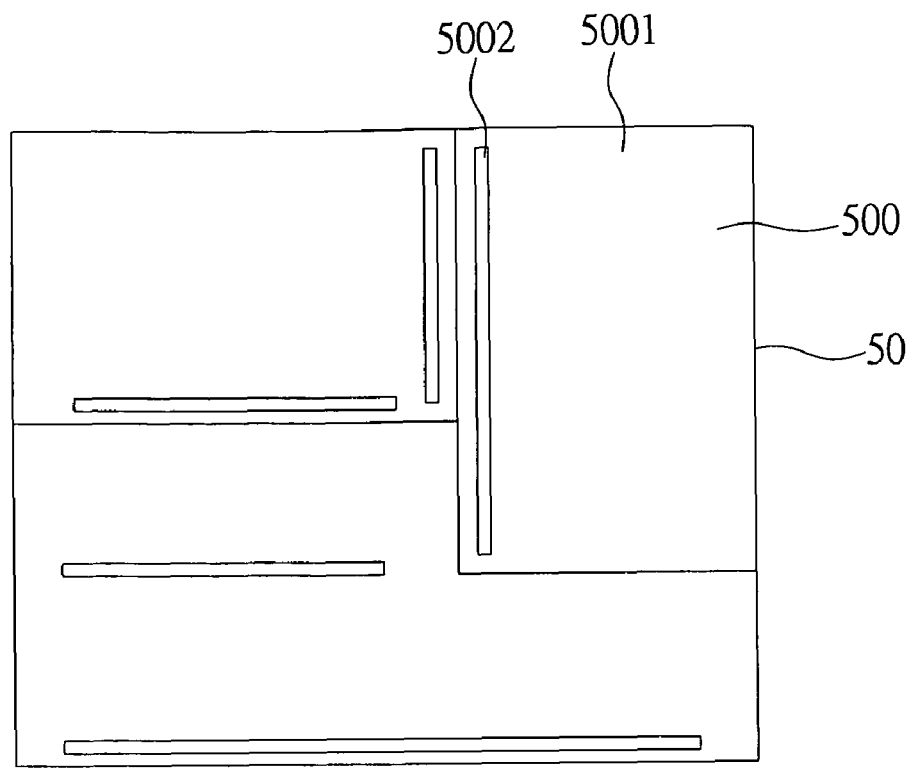
FIGS. 3A to 3C are schematic diagrams showing a multi-substrate region-based package and a method for fabricating the same according to a second embodiment of the present invention.
Figure 3B:
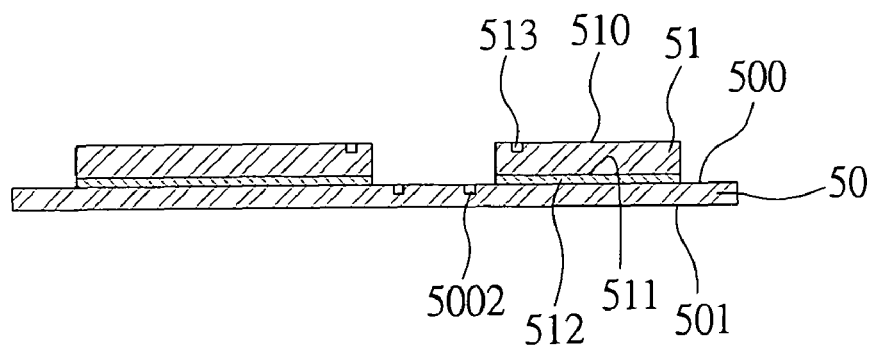
Figure 3C:
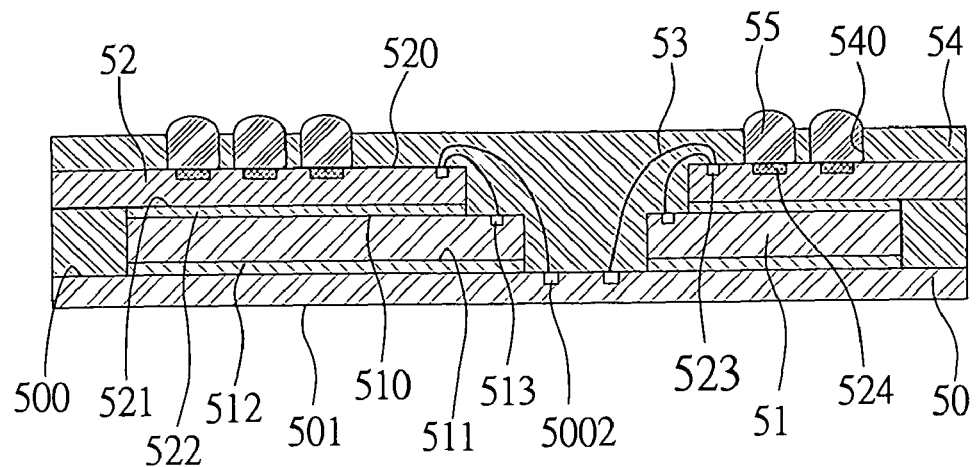

FIGS. 3A to 3C are schematic diagrams showing a multi-substrate region-based package and a method for fabricating the same according to a second embodiment of the present invention. The second embodiment differs from the above first embodiment in that in the second embodiment, a plurality of stacked chips are disposed in the package.

As shown in FIG. 3A, a chip 50 having an active surface 500 and a non-active surface 501 (referring also to FIG. 3B) is provided. The active surface 500 of the chip 50 is divided into a plurality of functional regions 5001 each having an independent first electrical connecting portion 5002.

As shown in FIG. 3B, a plurality of sub-chips 51 are provided, each of the sub-chips 51 having an active surface 510 and a non-active surface 511. The active surface 510 of the sub-chip 51 is formed with a third electrical connecting portion 513, and the non-active surface 511 of the sub-chip 51 has an adhesive layer 512 attached thereto, allowing the sub-chip 51 to be attached to the active surface 500 of the chip 50 by the adhesive layer 512.

As shown in FIG. 3C, subsequent processes are similar to those described for the first embodiment. A plurality of substrates 52 are provided and stacked on the sub-chips 51 respectively. Each of the substrates 52 has a ball mounting surface 520 and an adhesive surface 521. The ball mounting surface 520 of the substrate 52 has a plurality of bond pads 524 formed thereon, and a second electrical connecting portion 523 corresponding to the first electrical connecting portion 5002 of the corresponding functional region 5001 and to the third electrical connecting portion 513 of the corresponding sub-chip 51. A plurality of bonding wires 53 are used to electrically connect the first, second and third electrical connecting regions 5002, 523, 513. An encapsulant layer 54 is then formed to encapsulate the substrates 52, the active surfaces 500, 510 of the chip 50 and sub-chips 51, and the bonding wires 53. The encapsulant layer 54 is also formed with a plurality of openings 540 for exposing the bond pads 524 of the substrates 52, and a conductive material 55 is disposed on the exposed bond pads 524.

By the above fabrication method, the present invention also provides a multi-substrate region-based package, comprising: a chip 50 having an active surface 500 and a non-active surface 501, wherein the active surface 500 is divided into a plurality of functional regions 5001 each having an independent first electrical connecting portion 5002; a plurality of sub-chips 51 each mounted on a corresponding one of the functional regions 5001 of the active surface 500 of the chip 50, wherein each of the sub-chips 51 has an active surface 510 and a non-active surface 511, and the active surface 510 has a third electrical connecting portion 513; a plurality of substrates 52 each mounted or stacked on a corresponding one of the sub-chips 51, wherein each of the substrates 52 has a ball mounting surface 520 and an adhesive surface 521, the ball mounting surface 520 including a plurality of bond pads 524 formed thereon, and a second electrical connecting portion 523 corresponding to the first electrical connecting portion 5002 of the corresponding functional region 5001 and to the third electrical connecting portion 513 of the corresponding sub-chip 51; a plurality of bonding wires 53 for electrically connecting the first, second and third electrical connecting portions 5002, 523, 513; an encapsulant layer 54 for encapsulating the substrates 52, the active surfaces 500, 510 of the chip 51 and sub-chips 51, and the bonding wires 53, wherein the encapsulant layer 54 has a plurality of openings 540 for exposing the bond pads 524 of the substrates 52; and a conductive material disposed on the bond pads 524 and in the openings 540.

The non-active surface 511 of the sub-chip 51 has an adhesive layer 512 by which the sub-chip 51 is attached to the active surface 500 of the chip 50. The adhesive surface 521 of the substrate 52 has an adhesive layer 522 by which the substrate 52 is attached to the active surface 510 of the corresponding sub-chip 51.

Third Embodiment

Figure 4:
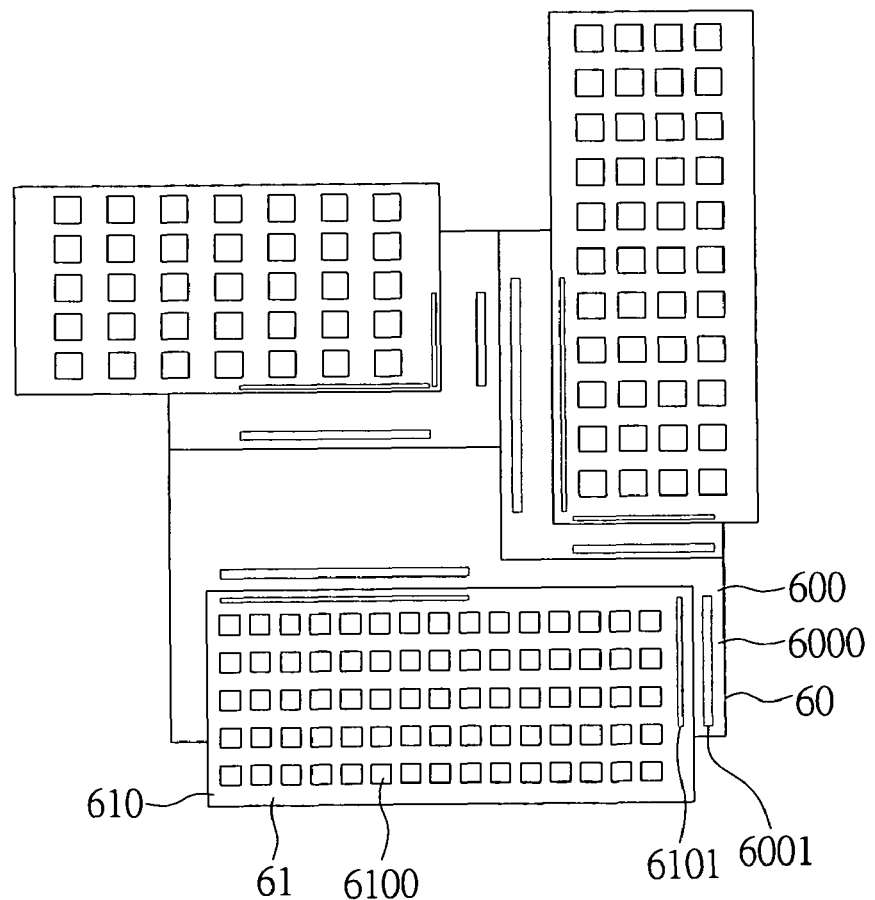
FIG. 4 is a schematic diagram showing a multi-substrate region-based package according to a third embodiment of the present invention.

FIG. 4 is a schematic diagram showing a multi-substrate region-based package according to a third embodiment of the present invention. In the above first and second embodiments, the substrate is smaller in area that that of the corresponding functional region of the chip, while in this third embodiment, the substrate can be larger in size than that of the functional region of the chip.

As shown in FIG. 4, each of the substrates 61 is larger in area than that of a corresponding one of the functional regions 6000 of the active surface 600 of the chip 60. The second electrical connecting portion 6101 of the ball mounting surface 610 of each of the substrates 61 is electrically connected to the first electrical connecting portion 6001 of the corresponding functional region 6000 of the chip 60, and a conductive material is disposed on the bond pads of each of the substrates 61. The rest of the fabrication processes and structural arrangement are substantially identical to those described in the first and second embodiments, and thus detailed descriptions thereof are not repeated here.

Therefore, since the active surface 400, 500, 600 of the chip 40, 50, 60 has a plurality of functional regions 4001, 5001, 6000 each being mounted with and electrically connected to a corresponding substrate 31, 52, 61, and the substrate 31, 52, 61 can be larger or smaller in area than the corresponding functional region 4001, 5001, 6000, the design of circuit layout for the chip 40, 50, 60 is not limited by the size and position of the substrate 31, 52, 61. Therefore, the design of the functional regions 4001, 5001, 6000 of the chip 40, 50, 60 allows integral system design to be performed and allows the chip 40, 50, 60 or the package to be made smaller and thinner as desired. And the arrangement of the substrates 31, 52, 61 with the respective and corresponding functional regions 4001, 5001, 6000 prevents tearing or pulling of the bonding wires 41, 53, thereby maintaining integrity of the bonding wires 41, 53.

The invention has been described using exemplary preferred embodiments. However, it is to be understood that the scope of the invention is not limited to the disclosed arrangements. The scope of the claims, therefore, should be accorded the broadest interpretation, so as to encompass all such modifications and similar arrangements.

What is claimed is:

1. A multi-substrate region-based package, comprising:
   a chip having an active surface and a non-active surface, wherein the active surface of the chip is divided into a plurality of functional regions each having an independent first electrical connecting portion;
   a plurality of substrates each mounted to a corresponding one of the functional regions of the chip, wherein each of the substrates includes a plurality of bond pads and a second electrical connecting portion corresponding to the first electrical connecting portion of the corresponding one of the functional regions;
   a plurality of bonding wires electrically connecting the first electrical connecting portions of the functional regions to the corresponding second electrical connecting portions of the substrates; and
   an encapsulant layer encapsulating the active surface of the chip, the substrates and the bonding wires, and having a plurality of openings where the bond pads of the substrates are exposed.

2. The multi-substrate region-based package of claim 1, further comprising a conductive material disposed on the bond pads of the substrates.

3. The multi-substrate region-based package of claim 2, wherein the conductive material is reflowed to form conductive elements.

4. The multi-substrate region based package of claim 1, further comprising an adhesive layer attached to the substrates and the active surface of the chip.

5. The multi-substrate region-based package of claim 1, wherein each of the substrates has a ball mounting surface where the bond pads and the second electrical connecting portion are formed.

6. The multi-substrate region-based package of claim 1, further comprising a sub-chip mounted between each of the substrates and the chip, the sub-chip being electrically connected to a corresponding one of the substrates.

7. The multi-substrate region-based package of claim 6, wherein the sub-chip has an active surface, and the active surface of the sub-chip has a third electrical connecting portion that is connected to the second electrical connecting portion of the corresponding one of the substrates by bonding wires.

8. The multi-substrate region-based package of claim 7, wherein the sub-chip has a non-active surface having an adhesive layer attached to the active surface of the chip, and each of the substrates further includes an adhesive surface having an adhesive layer by which each of the substrates is attached to the active surface of the sub-chip.

9. The multi-substrate region-based package of claim 1, wherein each of the substrates is smaller in area than the corresponding one of the functional regions of the chip.

10. The multi-substrate region-based package of claim 1, wherein each of the substrates is larger in area than the corresponding one of the functional regions of the chip.

11. The multi-substrate region-based package of claim 1, wherein the first electrical connecting portion is situated on one side, two opposite sides, three sides or four sides of each of the functional regions.

12. A method for fabricating a multi-substrate region-based package, comprising:
   providing a chip and a plurality of substrates, wherein the chip has an active surface and a non-active surface, and the active surface is divided into a plurality of functional regions each having a first electrical connecting portion, and wherein each of the substrates includes a plurality of bond pads formed on a surface thereof and a second electrical connecting portion formed on at least a side of the surface of each of the substrates;
   attaching each of the substrates to a corresponding one of the functional regions of the chip;
   electrically connecting the first electrical connecting portions of the chip to the second electrical connecting portions of the substrates via a plurality of bonding wires; and
   forming an encapsulant layer on the chip to encapsulate the substrates and the bonding wires, the encapsulant layer having a plurality of openings where the bond pads of the substrates are exposed.

13. The method of claim 12, further comprising forming a conductive material on the bond pads of the substrates.

14. The method of claim 13, wherein the conductive material is reflowed to form conductive elements.

15. The method of claim 12, wherein the substrates are integrated on a substrate strip, and the substrate strip is formed with a plurality of openings for disposing the substrates therein and connecting the substrates to the substrate strip.

16. The method of claim 15, further comprising separating the chip attached with the substrates from the substrate strip.

17. The method of claim 12, further comprising attaching an adhesive layer to the substrates and the active surface of the chip.

18. The method of claim 12, further comprising disposing a sub-chip between the chip and each of the substrates, and electrically connecting the sub-chip to a corresponding one of the substrates.

19. The method of claim 12, wherein each of the substrates is smaller in area than the corresponding one of the functional regions of the chip.

20. The method of claim 12, wherein each of the substrates is larger in area than the corresponding one of the functional regions of the chip.

21. The method of claim 12, wherein the first electrical connecting portion is situated on one side, two opposite sides, three sides or four sides of each of the functional regions.

* * * * *